(12) United States Patent
Inagaki

(10) Patent No.: US 7,161,424 B2
(45) Date of Patent: Jan. 9, 2007

(54) SIGNAL OUTPUT APPARATUS

(75) Inventor: Yasuhiko Inagaki, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 88 days.

(21) Appl. No.: 10/999,518

(22) Filed: Nov. 30, 2004

(65) Prior Publication Data

US 2005/0162231 A1    Jul. 28, 2005

(30) Foreign Application Priority Data

Jan. 27, 2004    (JP)    ............... 2004-018765

(51) Int. Cl.
*H03F 1/14*    (2006.01)

(52) U.S. Cl. ............... 330/51; 327/291; 381/94.5

(58) Field of Classification Search ............... 327/124, 327/339; 381/94.5; 330/280
See application file for complete search history.

(56) References Cited

U.S. PATENT DOCUMENTS 5,642,074 A    6/1997    Ghaffaripour et al. ........ 330/51
6,788,137 B1 *    9/2004    Morita ........................ 330/10

* cited by examiner

*Primary Examiner*—Benny Lee
*Assistant Examiner*—Alan Wong
(74) *Attorney, Agent, or Firm*—Ladas & Parry LLP

(57) ABSTRACT

A signal output circuit for switching an output operation of an input signal is disclosed. The signal output circuit includes a delaying circuit for delaying a control pulse transmitted from outside, an integrating circuit for generating an integrated waveform of the control pulse of the delaying circuit, and an output operation switching circuit for switching an output operation of the input signal in accordance with the waveform output from the integrating circuit.

13 Claims, 8 Drawing Sheets

SIGNAL OUTPUT APPARATUS

BACKGROUND OF THE INVENTION

1. Field of the Invention

The present invention generally relates to a signal output circuit, and more particularly to a signal output apparatus for switching an output operation of an input signal.

2. Description of the Related Art

Conventionally, an audio amplifying circuit is known to amplify audio signals and output the signals to, for example, a headphone or a speaker.

In order to reduce the noise created upon turning on/off the electric power, the audio amplifying circuit has installed a shut-down function and a muting function.

FIG. 7 is a block diagram showing a configuration of an audio amplifying circuit.

An input signal is transmitted from a signal source 102 to an input terminal Tin of an audio amplifying circuit 101 via a direct current reduction condenser C41. The input signal transmitted to the input terminal Tin is transmitted to an amplifying circuit 111. The amplifying circuit 111 includes a differential amplifying circuit 121, an input resistor R31, a feedback resistor R32, and a switch 122, and is supplied with a reference voltage from a reference voltage generating circuit 112, thereby forming an inverting amplifying circuit.

The amplifying circuit 111 outputs a signal in accordance with the difference between the reference voltage from the reference voltage generating circuit 112 and the input signal transmitted to the input terminal $T_{in}$. The amplified signal generated in the amplifying circuit 111 is output to an output terminal Tout, and drives a speaker 103.

The switch 122 is disposed between a junction point of the input resistor R31 and the feedback resistor R32 and an inversion input terminal of the differential amplifying circuit 121, and is switched in accordance with a mute signal transmitted from a controller 104 to a control terminal $T_{cnt1}$. The switch 122 switches to connect the junction point of the input resistor R31 and the feedback resistor R32 and the inversion input terminal of the differential amplifying circuit 121 when the mute signal is at a high level, thereby allowing inverting amplification of the input signal, and outputting the input signal from the output terminal $T_{out}$.

Furthermore, the switch 122 switches to short circuit the output of the differential amplifying circuit 121 and the inversion input terminal of the differential amplifying circuit 121 when the mute signal is at a low level, thereby creating a mute state for preventing the input signal from being output from the output terminal $T_{out}$. Therefore, the switch 122 is switched in accordance with the mute signal transmitted from the controller 104 to the control terminal $T_{cnt1}$, thereby allowing control of the input signal transmitted to the differential amplifying circuit 121, and achieving control of the mute function.

Furthermore, the reference voltage generating circuit 112 includes a switch 131, a resistor R41, and a resistor R42. A constant voltage Vdd is applied to the reference voltage generating circuit 112. The constant voltage Vdd is applied to a series circuit including the resistors R41 and R42 via the switch 131. The switch 131 is switched on when a shut down signal transmitted from the controller 104 to a control terminal Tcnt2 is at a high level, thereby allowing the constant voltage Vdd to be applied to the series circuit including the resistors R41 and R42. The switch 131 is switched off when the shut down signal is at a low level, thereby stopping the applying of constant voltage Vdd to the series circuit including the resistors R41 and R42.

The resistors R41 and R42 divide the voltage of the constant voltage Vdd when the switch 131 is switched on, thereby generating the reference voltage, and the reference voltage is supplied to a non-inverting input terminal of the differential amplifying circuit 121. Accordingly, the amplifying circuit 111 assumes an operational state. Here, a condenser terminal $T_c$ is connected to a junction point of the resistors R41 and R42. A condenser C51 is connected at the outside of the condenser terminal $T_c$ and runs to ground. The condenser C51 connected to the condenser terminal $T_c$ absorbs a ripple of the reference voltage and serves to stabilize the reference voltage.

Next, an operation of the audio amplifying circuit 101 is described.

FIG. 8 is a diagram showing an operation of the audio amplifying circuit 101. FIG. 8(A) shows a shut down signal output from the controller 104, FIG. 8(B) shows a switching state of the switch 131, FIG. 8(C) shows a reference voltage supplied to the differential amplifying circuit 121, FIG. 8(D) shows a mute signal output from the controller 104, and FIG. 8(E) shows a switching state of the switch 122.

As shown in FIG. 8(A), the switch 131 is switched from off to on (as shown in FIG. 8(B)) when the shut down signal turns from a low level to a high level at time t10. By switching the switch 131 on, the reference voltage is generated by the resistors R41 and R42. Here, as shown in FIG. 8(C), the reference voltage is gradually increased due to the externally connected condenser C51, and reaches the predetermined level at time t11. When the reference voltage reaches a predetermined level at time t11, a shutdown state of the differential amplifying circuit 121 is released, and becomes an operational state.

The controller 104 counts for a predetermined time from time t10, and outputs the mute signal at time t12 being the time that the predetermined time has elapsed, as shown in FIG. 8(D). As shown in FIG. 8(E), the switch 122 of the amplifying circuit 111 is switched on by the mute signal, thereby releasing the mute state of the input signal, amplifying the input signal in the amplifying circuit 111, and transmitting the amplified input signal to the speaker 103.

Accordingly, in the conventional example, the generation of the reference voltage in the reference voltage generation circuit 112, the operation of the amplifying circuit 111, and the shutdown function are controlled based on the shutdown signal from the controller 104. Furthermore, the mute function of the amplifying circuit 111 is controlled based on the mute signal from the controller 104.

In the conventional audio amplifying circuit, the shutdown signal and the mute signal are to be input separately into an integrated circuit. This, therefore, increases the number of external pins of the integrated circuit, and makes size-reduction difficult.

Accordingly, in order to reduce the number of external pins, an audio amplifying circuit for controlling both the shutdown function and the mute function in accordance with the level of the shutdown signal is proposed, as disclosed in U.S. Pat. No. 5,642,074.

In the conventional audio amplifying circuit, the shutdown function and the mute function are controlled by separately transmitting a shutdown signal for controlling the shutdown function and a mute signal for controlling the mute function from an external controller. Therefore, the shutdown signal and the mute signal are required to be generated at the external controller, and control of the timing for generating the signals is required. Accordingly, this is a processing burden for the controller.

Furthermore, in controlling both the shutdown function and the mute function in accordance with the level of the shutdown signal, it is difficult to accurately manage the timing of the control of the shutdown function and the control of the mute function. There are also some cases where noise is output during the amplification rise time.

SUMMARY OF THE INVENTION

It is a general object of the present invention to provide a signal output circuit that substantially obviates one or more of the problems caused by the limitations and disadvantages of the related art.

Features and advantages of the present invention are set forth in the description which follows, and in part will become apparent from the description and the accompanying drawings, or may be learned by practice of the invention according to the teachings provided in the description. Objects as well as other features and advantages of the present invention will be realized and attained by signal output circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a signal output circuit for switching an output operation of an input signal, the signal output circuit including: a delaying circuit for delaying a control pulse transmitted from outside; an integrating circuit for generating an integrated waveform of the control pulse of the delaying circuit; and an output operation switching circuit for switching an output operation of the input signal in accordance with the waveform output from the integrating circuit.

In the signal output circuit according to an embodiment of the present invention, the output operation switching circuit may include a first output circuit for performing a first output operation on the input signal, a second output circuit for performing a second output operation on the input signal, and a differential circuit for executing a differential operation which switches between a first driving current for driving the first output circuit and a second driving current for driving the second output circuit in accordance with the waveform output from the integrating circuit.

In the signal output circuit according to an embodiment of the present invention, the first output circuit may include an amplifying circuit for amplifying the input signal, wherein the second output circuit includes a muting circuit for muting an output signal.

In the signal output circuit according to an embodiment of the present invention, both the first output circuit and the second output circuit may include a differential circuit.

In the signal output circuit according to an embodiment of the present invention, the output operation switching circuit may further include a reference voltage source for generating a reference voltage, and a switching circuit for comparing the output of the integrating circuit and the reference voltage, the switching circuit supplying the first driving current to the first output circuit and stopping supply to the second output circuit when the output of the integrating circuit is greater than the reference voltage, the switching circuit supplying the second driving current to the second output circuit and stopping supply to the first output circuit when the output of the integrating circuit is less than the reference voltage.

Other objects and further features of the present invention will be apparent from the following detailed description when read in conjunction with the accompanying drawings.

DESCRIPTION OF THE PREFERRED EMBODIMENTS

[Configuration of Signal Output Circuit]

Figure 1:
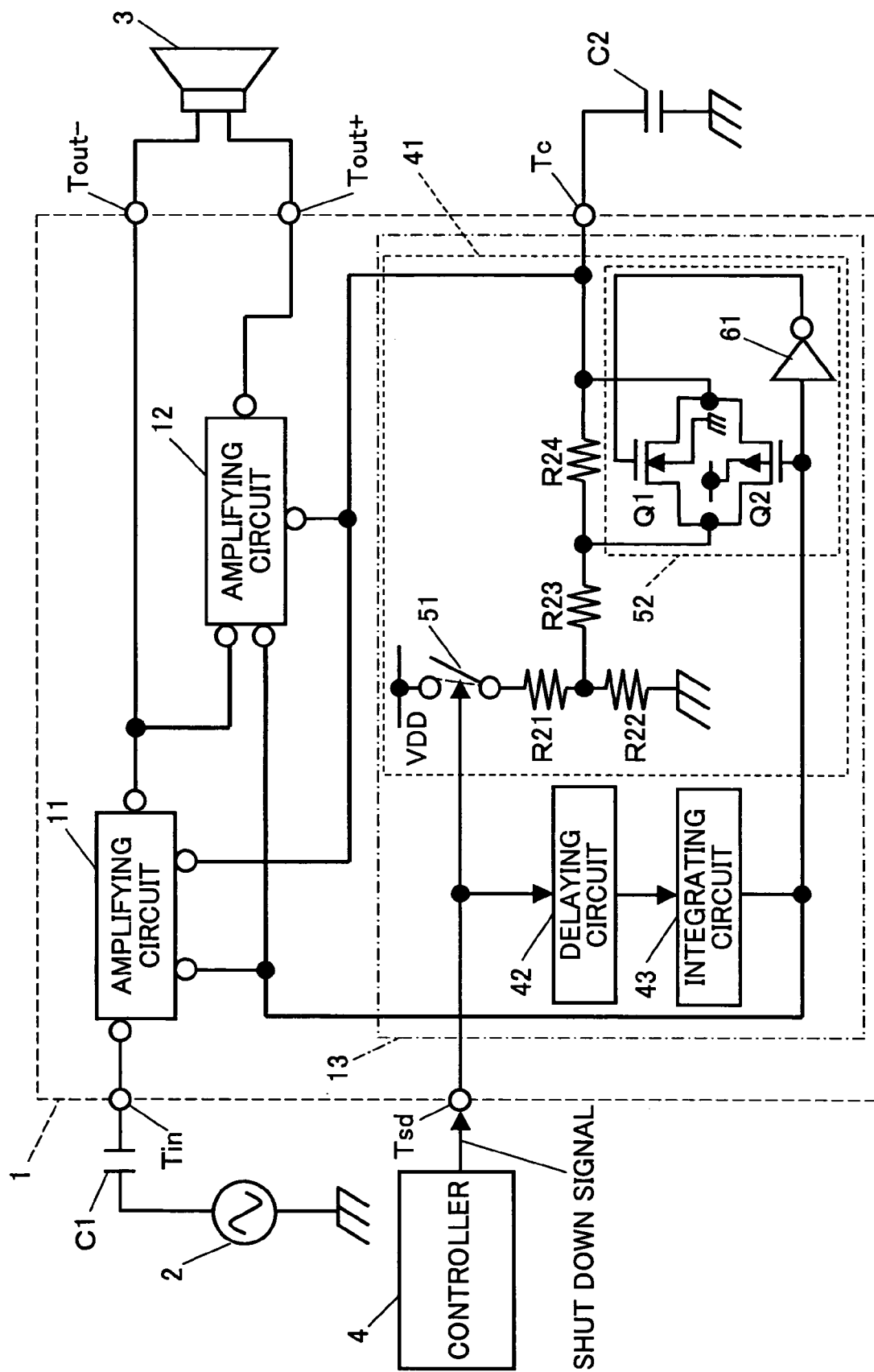
FIG. 1 is a block diagram showing a configuration of a signal output circuit according to an embodiment of the present invention.

FIG. 1 is a block diagram showing a configuration of a signal output circuit according to an embodiment of the present invention.

In this embodiment, an audio amplifying circuit is described as an example of the signal output circuit. According to this embodiment, an audio amplifying circuit 1 is formed of a single-chip semiconductor integrated circuit. The audio amplifying circuit 1 includes amplifying circuits 11, 12, and a function control circuit 13. The audio amplifying circuit 1 also includes an input terminal $T_{in}$, output terminals $T_{out}-$, $T_{out}+$, a shutdown control terminal $T_{sd}$, and a condenser terminal $T_c$. An input signal is transmitted from a signal source 2 to the input terminal $T_{in}$ via a condenser C1. A shutdown signal is transmitted from a controller 4 to the shutdown control terminal $T_{sd}$. Furthermore, a speaker 3 is connected between the output terminals $T_{out}-$, $T_{out}+$. Furthermore, a grounded condenser 2 is connected to the condenser terminal $T_c$.

The input signal transmitted to the input terminal $T_{in}$ is first transmitted to the amplifying circuit 11. The amplifying circuit 11 performs inverting amplification on the input signal transmitted from the input terminal $T_{in}$, and transmits the inverted amplified input signal to the output terminal $T_{out}-$ and the amplifying circuit 12. The amplifying circuit 12 performs inverting amplification on the signal output from the amplifying circuit 11, and transmits the inverted amplified output signal to output terminal $T_{out}+$. The speaker 3 connected between the output terminals $T_{out}-$, $T_{out}+$ is driven in accordance with an input signal received therefrom, and outputs audio in accordance with the input signal.

It is to be noted that the amplifying circuits 11 and 12 are installed with a mute function, which mute function is controlled by the function control circuit 13.

[Amplifying Circuit 11]

Figure 2:
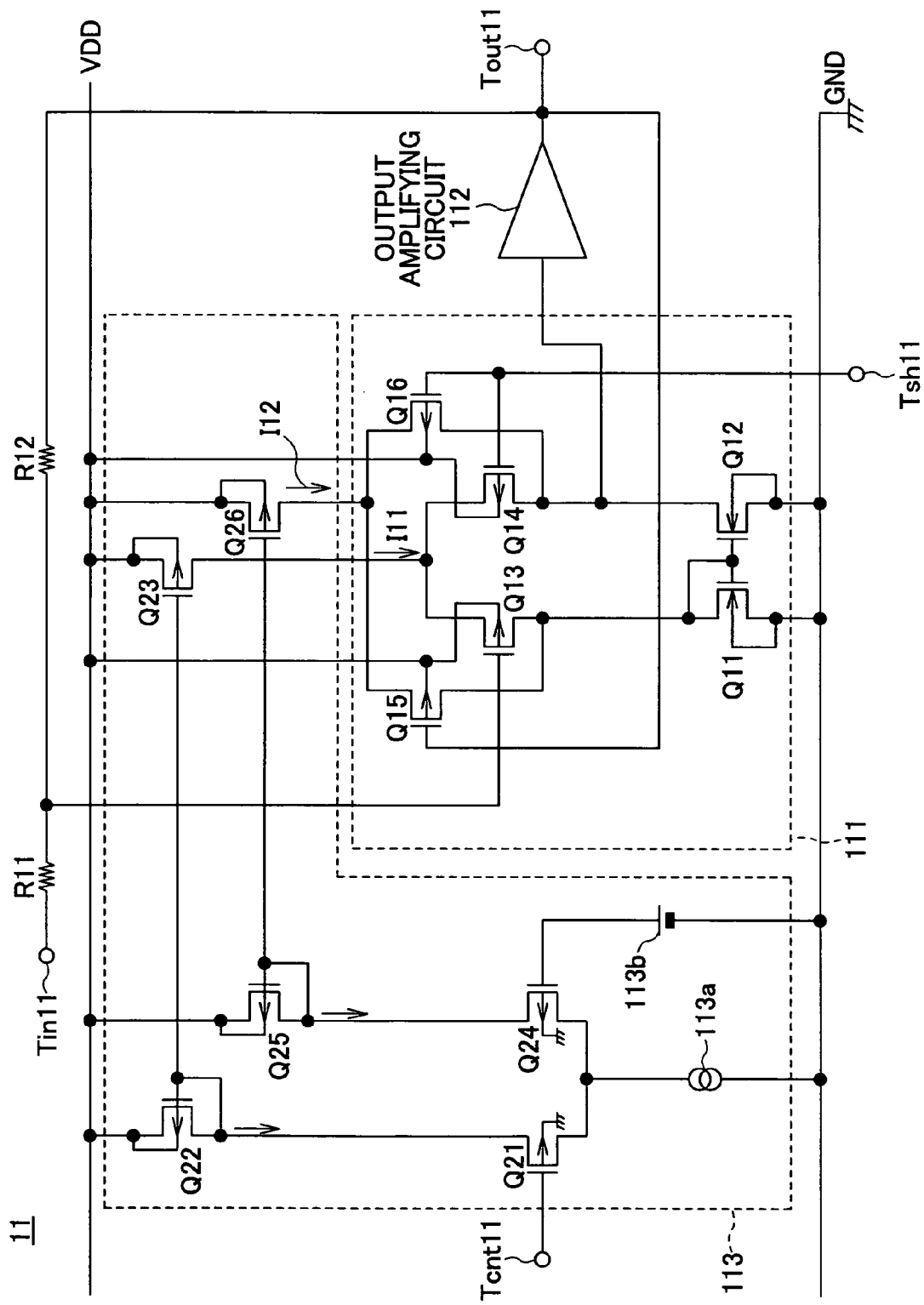
FIG. 2 is a diagram showing an exemplary configuration of an amplifying circuit 11.

FIG. 2 shows an exemplary configuration of the amplifying circuit 11.

The amplifying circuit 11 includes resistors R11, R12, a differential circuit part 111, an output amplifying circuit 112, and a switching circuit 113.

The input terminal $T_{in}$ is connected to a terminal $T_{in}11$, and an input signal is transmitted from the audio amplifying circuit 1 thereto. Furthermore, the terminal $T_{in}11$ is connected to one end of the resistor R11 in the amplifying circuit 11. The other end of the resistor R11 is connected to an end of the resistor R12 and the differential circuit part 111.

The other end of the resistor R12 is connected to a terminal $T_{out}11$. The terminal $T_{out}11$ is connected to the output terminal $T_{out}-$ and the terminal $T_{in}11$ of the amplifying circuit 12 at the outside.

Furthermore, the differential circuit part 111 is formed of transistors Q11–Q16. The transistors Q11–Q14 include MOS field-effect transistors, form an inverting circuit with the resistors R11 and R12, and perform inverting output on a signal in accordance with the difference between the input signal transmitted from the terminal $T_{in}11$ and the reference voltage supplied from the function control circuit 13. The signal output from the differential circuit part 111 is transmitted to the output amplifying circuit 112. Furthermore, the transistors Q11, Q12, Q15, and Q16 include MOS field-effect transistors, form a mute circuit with the same configuration as that of the transistors Q11–Q14, and mute the input signal during operation.

The output of the differential circuit part 111 is transmitted to the output amplifying circuit 112. The output amplifying circuit 112 amplifies the output signal of the differential circuit 111, and outputs the signal from the terminal $T_{out}11$.

Furthermore, a differential circuit A including the transistors Q11–Q14 is driven by a first driving current I11 supplied from the switching circuit 113, and a differential circuit B including the transistors Q11, Q12, Q15, and Q16 is driven by a second driving current I12 supplied from the switching circuit 113.

The switching circuit 113 includes MOS field-effect transistors Q21–Q26, a current source 113a, and a voltage source 113b.

The transistors Q22 and Q23 form a current mirror that generates the first driving current I11. Furthermore, the transistors Q25 and Q26 form a current mirror that generates the second driving current I12.

The drain of the transistor Q22 is connected to the drain of the transistor Q21, and the drain of the transistor Q25 is connected to the transistor Q24.

The sources of transistors Q21 and Q24 are both connected to the current source 113a, and the transistors Q21 and Q24 are configured to perform differential operations. Furthermore, the gate of the transistor Q21 is connected to a terminal $T_{cnt}11$. Furthermore, a reference voltage from the voltage source 113b is applied to the gate of the transistor Q24.

When the output of the terminal $T_{cnt}11$ becomes smaller than the reference voltage, the transistor Q21 is switched off, and the transistor Q24 is switched on. This allows current to be guided from the transistor Q25 to the current source 113a via the transistor Q24, the second driving current I12 to be supplied from the transistor Q26 to the differential circuit part 111, and the supply of the first driving current I11 to be stopped. Accordingly, the mute circuit (differential circuit B) including the transistors Q11, Q12, Q15, and Q16 is driven, and operation of the differential circuit A including the transistors Q11–Q14 is stopped.

When the output of the terminal $T_{cnt}11$ becomes larger than the reference voltage, the transistor Q21 is switched on, and the transistor Q24 is switched off. This allows current to be guided from the transistor Q22 to the current source 113a via the transistor Q21, the first driving current I11 to be supplied from the transistor Q23 to the differential circuit part 111, and the supply of the second driving current I12 to be stopped. Accordingly, the differential circuit A including the transistors Q11–Q14 is driven, and operation of the mute circuit (differential circuit B) including the transistors Q11, Q12, Q15, and Q16 is stopped.

It is to be noted that the amplifying circuit 12 has the same configuration as that of the amplifying circuit 11, and operates likewise. Therefore, further description thereof is omitted.

[Function Control Circuit 13]

The function control circuit 13 includes a reference voltage generating circuit 41, a delaying circuit 42, and an integrating circuit 43. The reference voltage generating circuit 41 is a circuit for executing a shutdown function. The reference voltage generating circuit 41 includes a switch 51, resistors R21–R24, and a bypass circuit 52. Furthermore, the reference voltage generating circuit 41 has a grounded condenser C2 connected to the condenser terminal $T_c$ at the outside.

The switch 51 is switched on when the shutdown signal is at a high level, and is switched off when the shutdown signal is at a low level. When the switch 51 is switched on, a constant voltage Vdd is applied to a series circuit including the resistors R21 and R22. The constant voltage Vdd is divided by the resistors R21 and R22 and is output from a junction point of the resistors R21 and R22.

The junction point of the resistors R21 and R22 is connected to a terminal $T_{sh}11$ of the amplifying circuit 11 and the amplifying circuit 12. Furthermore, a junction point of the resistor R24 and the terminal $T_{sh}11$ of the amplifying circuit 11 and the amplifying circuit 12 is connected to the condenser terminal $T_c$.

The condenser terminal $T_c$ is connected to the condenser C2. The condenser C2 absorbs the electric charge applied to the terminal $T_{sh}11$ of the amplifying circuit 11 and the amplifying circuit 12.

When the switch 51 is switched on, the applied voltage for the terminal $T_{sh}11$ of the amplifying circuit 11 and the amplifying circuit 12 rises after being delayed for a time constant determined by the resistors R23, R24 and the condenser C2. Accordingly, the activation of the amplifying circuits 11 and 12 is delayed. Therefore, in order to accelerate the activation of the amplifying circuits 11 and 12, the bypass circuit 52, which bypasses the resistor R24 when the switch 51 is switched on, is provided.

The bypass circuit 52 forms a transfer gate for bypassing the resistor R24 with MOS field effect transistors Q1 and Q2 (having a CMOS (Complementary Metal Oxide Semiconductor) structure), and an inverting amplifier 61. The output of the delaying circuit 42 is applied to the gates of the MOS field effect transistors Q1 and Q2. When the output of the delaying circuit 42 is at a low level, the MOS field effect transistors Q1 and Q2 are switched on, and when the output of the delaying circuit 42 is at a high level, the MOS field effect transistors Q1 and Q2 are switched off.

Accordingly, when the shutdown signal is transmitted to the bypass circuit 52 and the switch 51 is switched on, the bypass circuit 52 bypasses the resistor R24. Since the resistance is reduced when the resistor R24 is bypassed by the bypass circuit 52, the charging current to the condenser C2 connected to the condenser terminal Tc is increased. This allows the condenser C2 to be charged at a higher speed.

Accordingly, the rise time of the applied voltage of the terminal $T_{sh}11$ of the amplifying circuit 11 and the amplifying circuit 12 becomes shorter, thereby allowing the amplifying circuits 11 and 12 to operate sooner.

It is to be noted that the delaying circuit 42 is a circuit for controlling a mute function, in which a shutdown signal is delayed for a predetermined delay time, and a mute signal is output. The predetermined delay time is a period needed for the amplifying circuits 11, 12 to become effectively operational beginning from the activation of the amplifying circuits 11, 12 in response to the shutdown signal.

Figure 3:
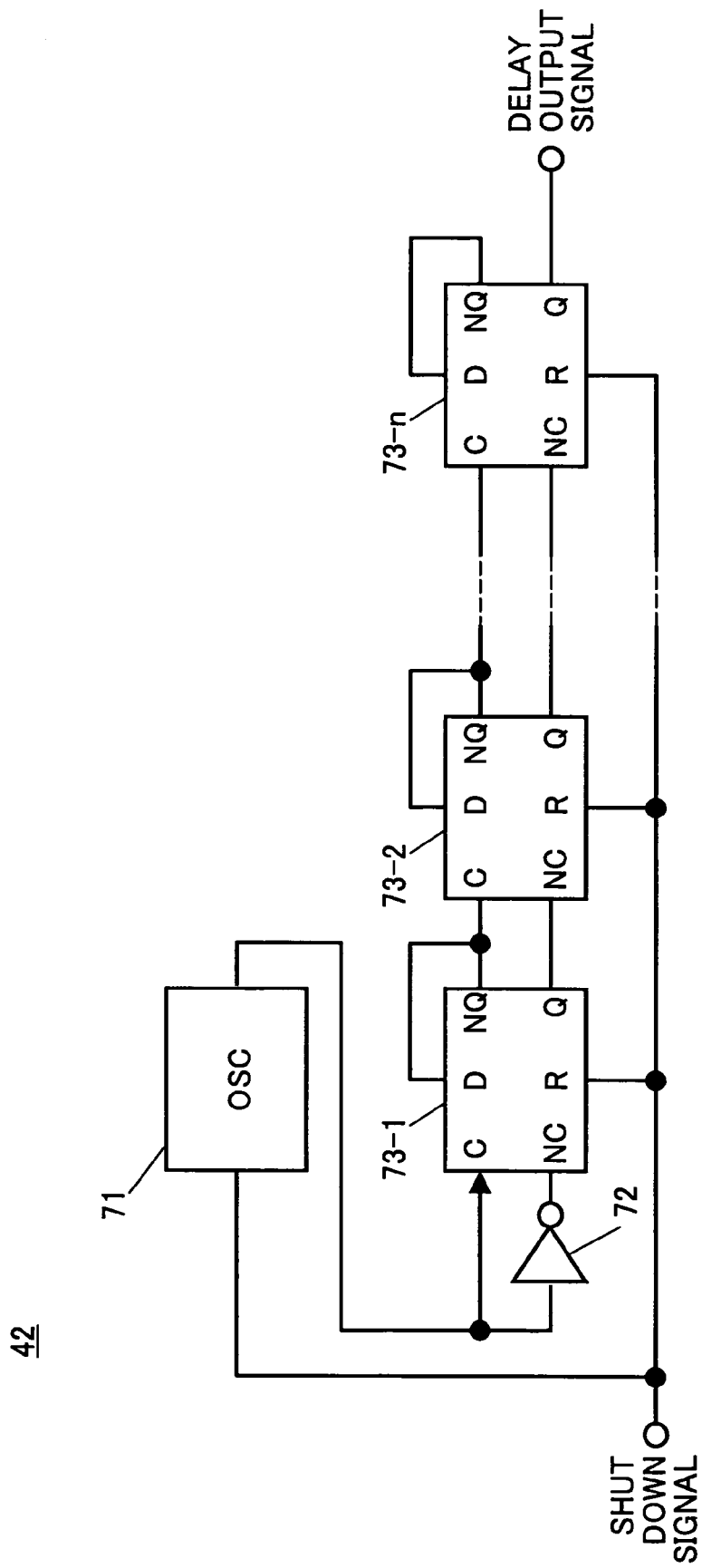
FIG. 3 is a diagram showing an exemplary configuration of a delaying circuit 42.

FIG. 3 is a block diagram showing a configuration of the delaying circuit 42.

The delaying circuit 42 includes a logic timer having an oscillating circuit 71, an inverter 72, and flip-flops 73-1 to 73-n.

The oscillating circuit 71 is activated and begins oscillation when the shutdown signal transmitted to the shutdown control terminal $T_{sd}$ is switched from a low level to a high level. The oscillation circuit 71 transmits an oscillation output to the inverter 72 and the flip-flop 73-1. The inverter 72 inverts and outputs the oscillation output of the oscillation circuit 71.

The flip-flops 73-1 to 73-n include D flip-flops (delay flip-flops), in which a shutdown signal is transmitted to a reset terminal R for allowing an output Q to be reset to a low level. In the flip-flop 73-1, the oscillation output of the oscillating circuit 71 is transmitted to a clock terminal C, and an inversion oscillation output inverted by the inverter 72 is transmitted to an inversion clock terminal NC. Furthermore, in the flip-flop 73-1, an inversion output terminal NQ is connected to a data terminal D. The inversion output terminal NQ is connected to a clock terminal C of a subsequent stage flip-flop 73-2, and a non-inverted output terminal Q is connected to the inversion clock terminal NC of the flip-flop 73-2.

The above-described connection between the flip-flop 73-1 and the adjacent flip-flop 73-2 is repeated for n flip-flops, thereby obtaining a connection from flip-flop 73-1 to flip-flop 73-n, and forming a so-called up-counter. The output from the non-inverted output terminal Q of the last stage flip-flop 73-n allows the shutdown signal to rise to a high level after the oscillation output of the oscillating circuit 71 is counted up for a number of times being a second power of n. Therefore, output of a delayed shutdown signal can be obtained.

Accordingly, the delaying circuit 42, forming a logic timer, is able to set the delay time more accurately compared to setting the delay time with a condenser or the like, since the delay time is set with a digital process.

It is to be noted that although this embodiment employs a logic timer as the delaying circuit 42, other configurations which set the delay time with a digital process may alternatively be employed.

The delay output of the delaying circuit 42 is transmitted to an integrating circuit 43.

[Integrated Circuit 43]

Figure 4:
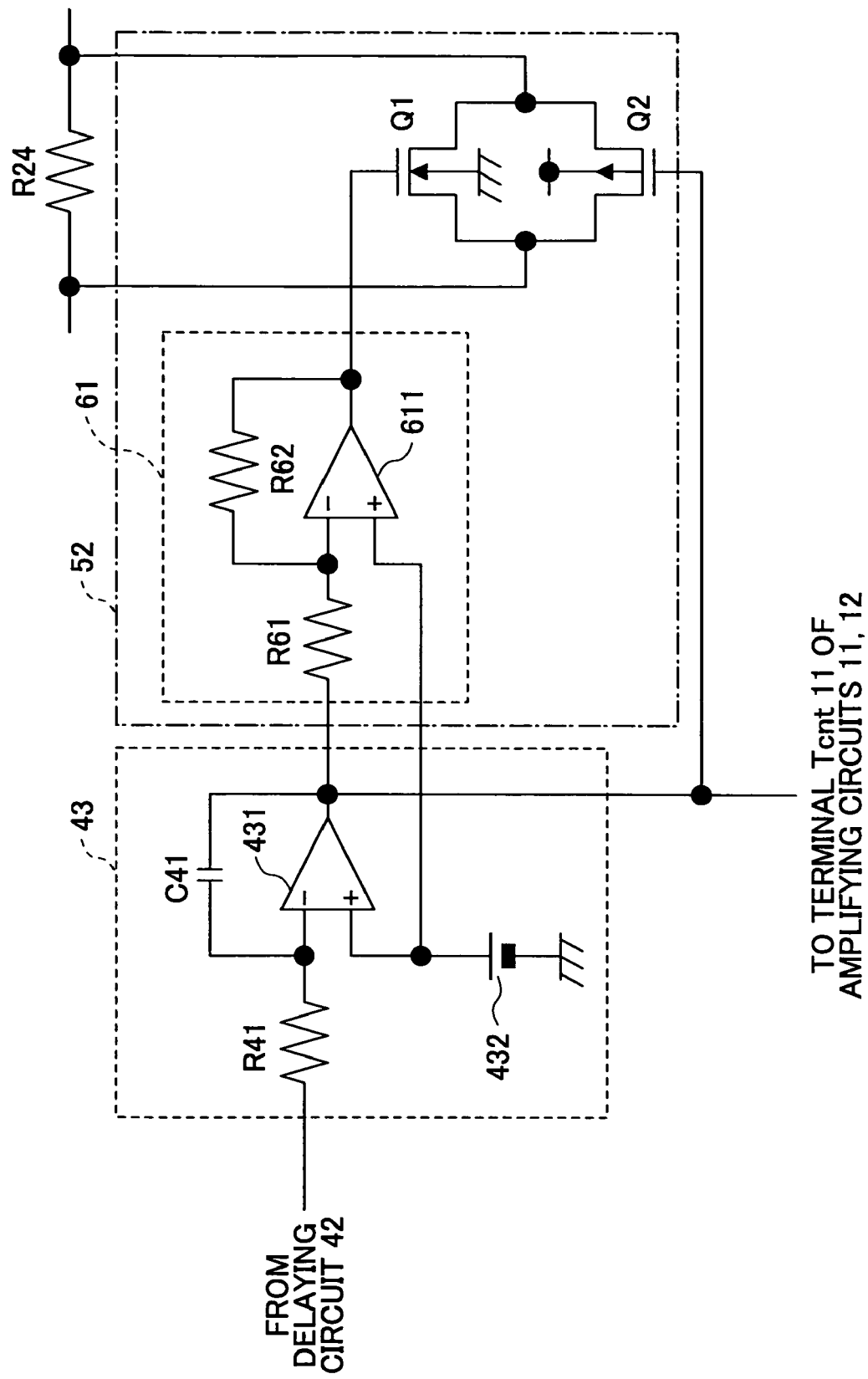
FIG. 4 is a block diagram showing an exemplary part of a function control circuit 13.

FIG. 4 is a block diagram showing a part of the function control circuit 13.

The integrating circuit 43 includes a resistor R41, an operational amplifier 431, a voltage source 432, and a capacitor C41.

The delay output of the delaying circuit 42 is connected to an inversion input terminal of the operational amplifier 431 via the resistor R41. As for the operational amplifier 431, the capacitor C41 is connected between an output terminal and an inverted input terminal, and a reference voltage from the voltage source 432 is applied to a non-inverted input terminal.

The integrating circuit 43 outputs a signal of a waveform obtained by integrating the delay output of the delaying circuit 42.

Figure 5:
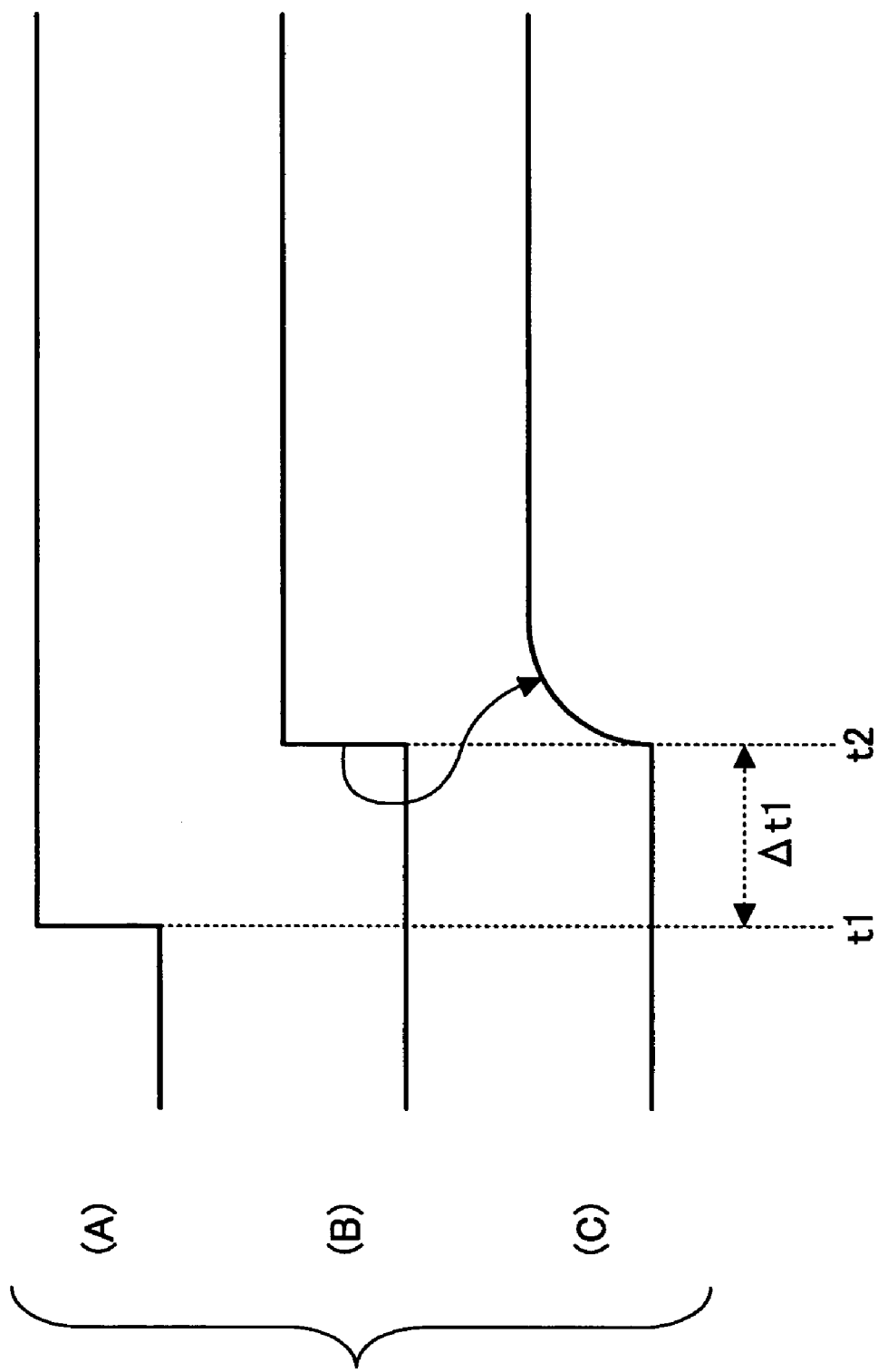
FIG. 5 is a diagram for explaining an operation of an integrating circuit 43.

FIG. 5 is a diagram for explaining an operation of the integrating circuit 43. FIG. 5(A) shows a shutdown signal, FIG. 5(B) shows a delay output of the delaying circuit, and FIG. 5(C) shows an integrating output waveform of the integrating circuit 43.

When the shutdown signal rises at time t1 (as shown in FIG. 5(A)), the delay output of the delaying circuit 42 rises at delay time t2 which is a predetermined time $\varDelta T1$ delayed by the delaying circuit 42 (as shown in FIG. 5(B)). The delay output of the delaying circuit 42 is integrated by the integrating circuit 43, thereby the waveform of the rise is formed with an obtuse shape, as shown in FIG. 5(C). The obtuse waveform is transmitted to the terminal $T_{cnt}11$ of the amplifying circuit 11 and to corresponding terminals (not shown) of the amplifying circuit 12 and the reference voltage generating circuit 41, and switching of the functions is executed.

It is to be noted that the integrating circuit 43 may form a first passive filter including a resistor and a capacitor.

The integrated signal of the integrating circuit 43 is transmitted to the terminal Tcnt11 and corresponding terminals of the amplifying circuits 11 and 12, respectively, and the bypass circuit 52 of the reference voltage generating circuit 41.

The integrated output transmitted from the integrating circuit 43 to the terminal Tcnt11 of the amplifying circuits 11 and 12 is then transmitted to the switching circuit 113. The switching circuit 113 forms a differential circuit, in which switching between the first driving current I11 and the second driving current I12 is performed gradually in a case of executing the switching with the integrated output from the integrating circuit 43. Therefore, in the differential circuit part 11, the switching between the differential circuit A including the transistors Q11–Q14 and the mute circuit (differential circuit B) including the transistors Q11, Q12, Q15, and Q16 can be performed smoothly, and can prevent generation of noise or the like.

It is to be noted that although a differential circuit is employed as the switching circuit 113 for smoothly switching functions in accordance with the integrated output of the integrating circuit 43, the switching of functions may alternatively be performed with a typical analog switch or the like.

[Bypass Circuit 52]

As described above, the bypass circuit 52 forms a transfer gate for bypassing the resistor R24 with MOS field effect transistors Q1 and Q2 (having a CMOS (Complementary Metal Oxide Semiconductor) structure), and an inverting amplifier 61. The inverting amplifier 61 is an inverting amplifying circuit including resistors R61, R62, and an operational amplifier 611, and outputs a signal of an inverted integrated output of the integrating circuit 43.

The output signal of the inverting amplifier 61 is transmitted to the gate of the MOS field effect transistor Q1. Furthermore, the integrated output of the integrating circuit 43 is directly applied to the gate of the MOS field effect transistor Q2. The bypass circuit 52 is switched on when the integrated output of the integrating circuit 43 is no more than an ON level, and is switched off when the integrated output of the integrating circuit 43 is no less than an OFF level.

Since the switching operation is executed in accordance with the integrated output of the integrating circuit 43, the transistors Q1, Q2 are prevented from being switched rapidly. Thereby, the generated reference voltage changes slowly. Accordingly, generation of noise can be prevented.

[Operation]

Next, an operation of the signal output circuit according to an embodiment of the present invention is described.

Figure 6:
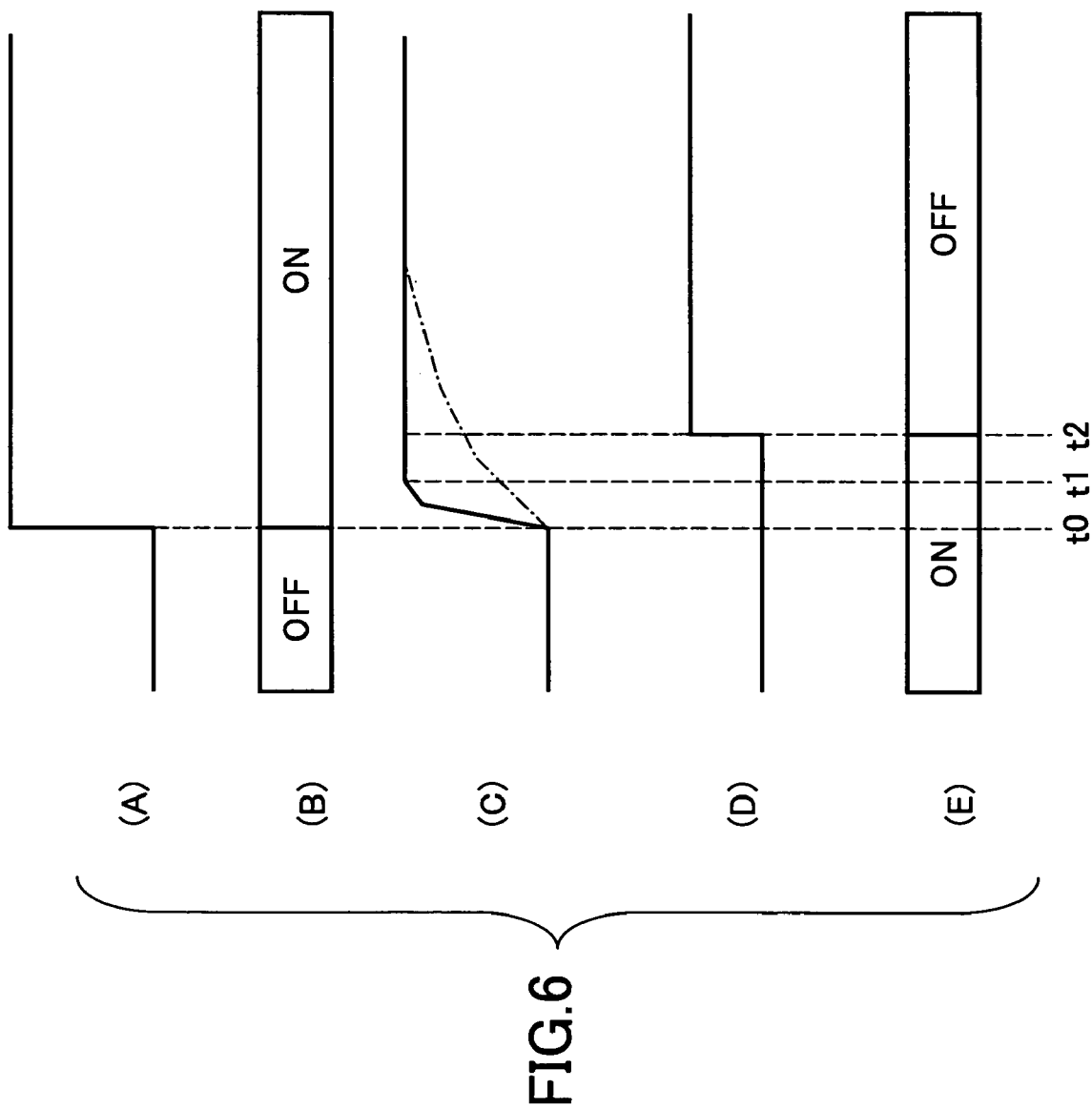
FIG. 6 is a diagram for explaining an embodiment of the present invention.
Figure 7:
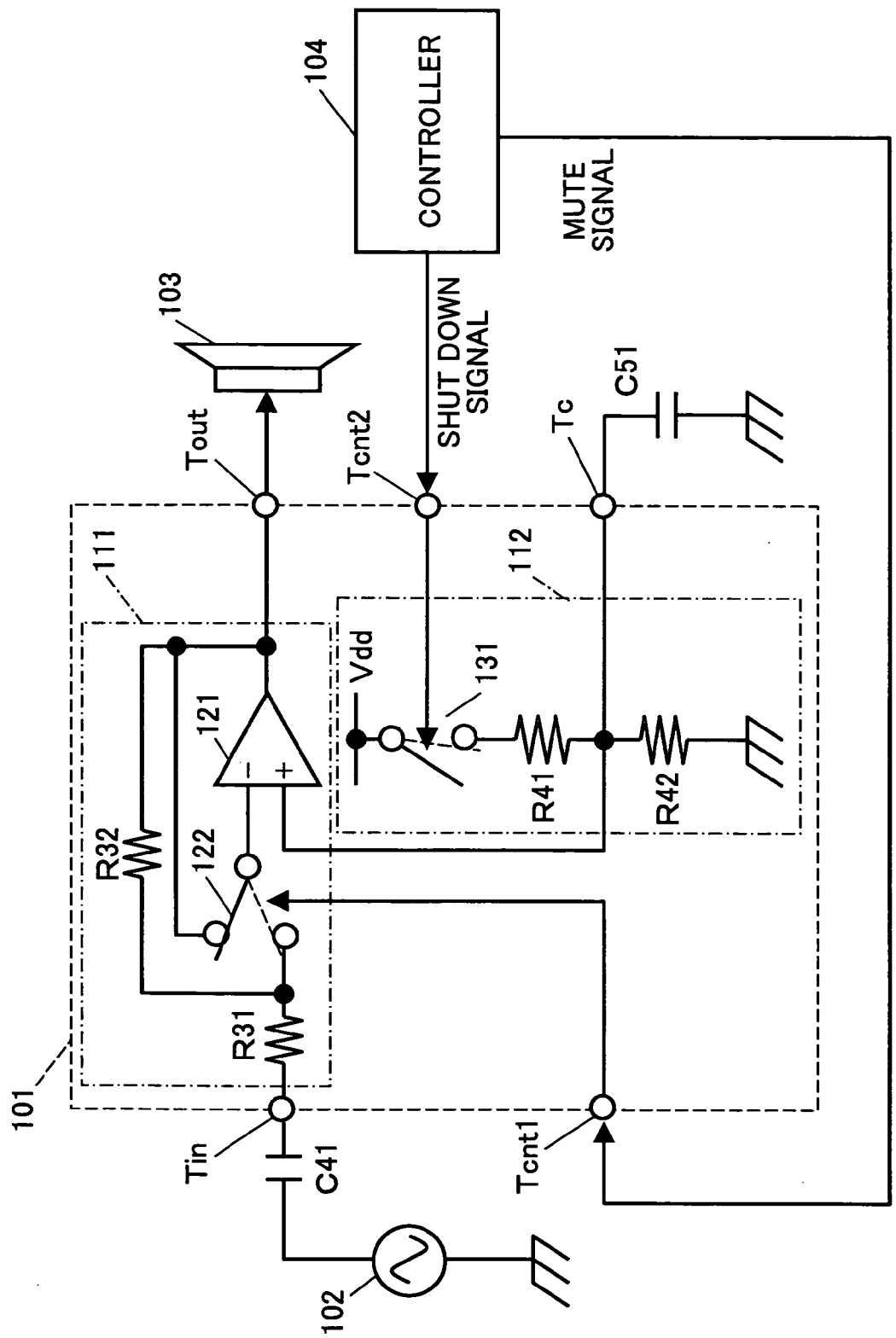
FIG. 7 is a block diagram showing an exemplary configuration of an audio amplifying circuit.
Figure 8:
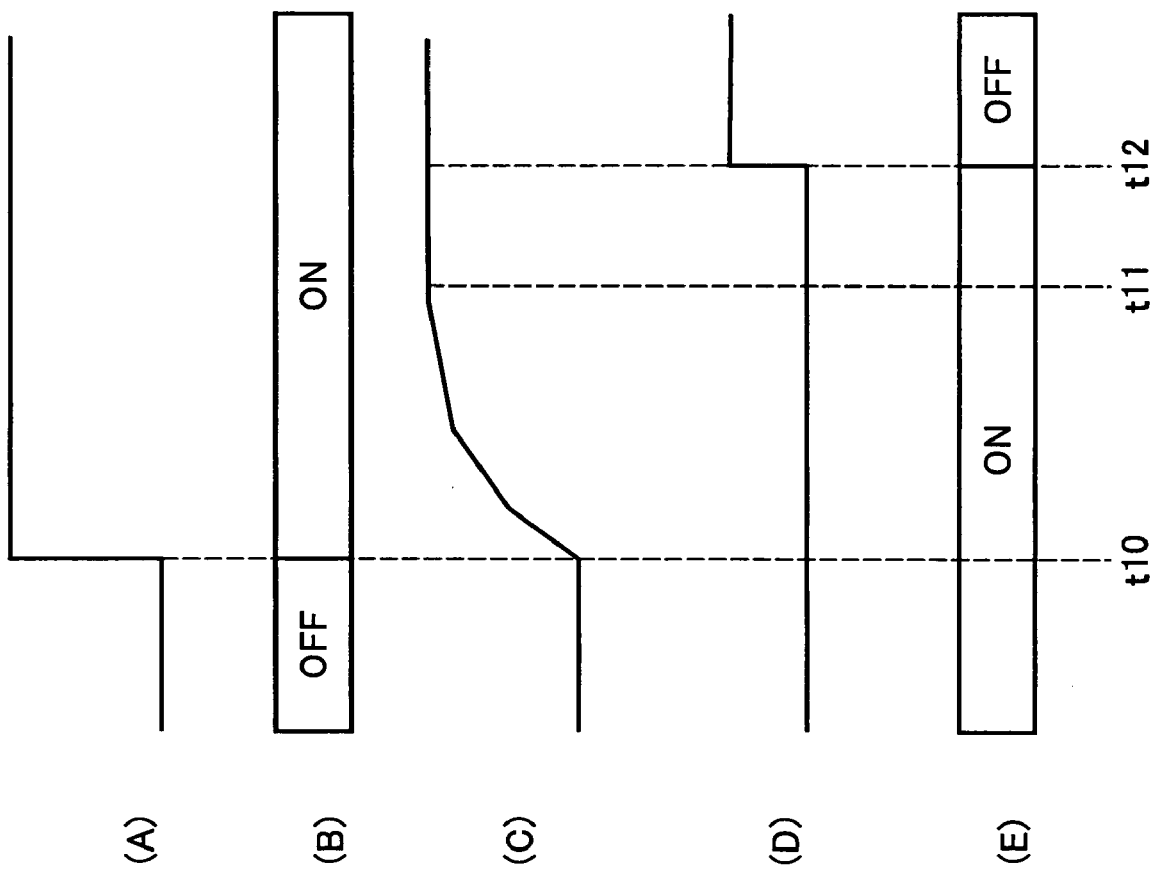
FIG. 8 is a diagram for explaining an operation of an audio amplifying circuit 101.

FIG. 6 shows a diagram for explaining an operation of the signal output circuit according to an embodiment of the present invention. FIG. 6(A) shows a shutdown signal transmitted from the controller 4 to the terminal Tsd, FIG. 6(B) shows a switching state of the switch 51, FIG. 6(C) shows an output reference voltage of the reference voltage generating circuit 41, FIG. 6(D) shows an output of the delaying circuit 42, and FIG. 6(E) shows a mute state of the amplifying circuits 11, 12.

When the shutdown signal is switched from a low level to a high level at time t0 (as shown in FIG. 6(A), the switch 51 is switched on (as shown in FIG. 6(B). Here, since the bypass circuit 52 is in the ON state, the condenser C2 is rapidly charged for applying a predetermined reference voltage to the terminal $T_{sh}11$ of the amplifying circuits 11, 12.

Then, after a predetermined delay time $\varDelta T$ has elapsed from time t0, i.e. at time t2 (>t1), the output of the delaying circuit 42 rises to a high level, the mute states of the amplifying circuits 11, 12 are released, and thereby the input signal is amplified in the amplifying circuits 11, 12 and transmitted to the speaker 3.

With the signal output circuit according to an embodiment of the present invention, since the mute state can be released gradually after the releasing of the shutdown state merely by transmitting a shutdown signal from the terminal $T_{sd}$, the number of external terminals can be reduced. Furthermore, the processing workload of the controller 4 can be reduced since the controller 4 simply generates a shutdown signal.

Furthermore, by delaying the shutdown signal and generating the mute signal for controlling the mute state in accordance with the integrated waveform of the shutdown signal, the mute state can be released gradually after the releasing of the shutdown state is finished. Therefore, a mute state can be obtained before activation of the amplifying circuits 11, 12, and a considerable change of output can be prevented from occurring when the amplifying circuits 11, 12 are activated, thereby achieving smooth activation.

Further, the present invention is not limited to these embodiments, but various variations and modifications may be made without departing from the scope of the present invention.

The present application is based on Japanese Priority Application No. 2004-018765 filed on Jan. 27, 2004, with the Japanese Patent Office, the entire contents of which are hereby incorporated by reference.

What is claimed is:

1. A signal output circuit for switching an output operation of an input signal, the signal output circuit comprising:
    a delaying circuit for delaying a control pulse transmitted from outside;
    an integrating circuit for generating an integrated waveform of the control pulse of the delaying circuit; and
    an output operation switching circuit for switching an output operation of the input signal in accordance with the waveform output from the integrating circuit;
    wherein the integrated waveform generated by the integrating circuit has an obtuse shape.

2. The signal output circuit as claimed in claim 1, wherein the output operation switching circuit includes
    a first output circuit for performing a first output operation on the input signal,
    a second output circuit for performing a second output operation on the input signal, and
    a differential circuit for executing a differential operation which switches between a first driving current for driving the first output circuit and a second driving current for driving the second output circuit in accordance with the waveform output from the integrating circuit.

3. The signal output circuit as claimed in claim 2, wherein the first output circuit includes an amplifying circuit for amplifying the input signal, wherein the second output circuit includes a muting circuit for muting an output signal.

4. The signal output circuit as claimed in claim 3, wherein both the first output circuit and the second output circuit include a differential circuit.

5. The signal output circuit as claimed in claim 2, wherein the output operation switching circuit further includes
    a reference voltage source for generating a reference voltage, and
    a switching circuit for comparing the output of the integrating circuit and the reference voltage, the switching circuit supplying the first driving current to the first output circuit and stopping supply to the second output circuit when the output of the integrating circuit is greater than the reference voltage, the switching circuit supplying the second driving current to the second output circuit and stopping supply to the first output circuit when the output of the integrating circuit is less than the reference voltage.

6. The signal output circuit as claimed in claim 5, wherein the first output circuit includes an amplifying circuit for amplifying the input signal, wherein the second output circuit includes a muting circuit for muting an output signal.

7. The signal output circuit as claimed in claim 6, wherein both the first output circuit and the second output circuit include a differential circuit.

8. A signal output circuit for switching an output operation of an input signal, the signal output circuit comprising:
    a delaying circuit for delaying a control pulse transmitted from outside;
    an integrating circuit for generating an integrated waveform of the control pulse of the delaying circuit; and
    an output operation switching circuit for switching an output operation of the input signal in accordance with the waveform output from the integrating circuit;
    wherein the output operation switching circuit includes
    a first output circuit for performing a first output operation on the input signal,
    a second output circuit for performing a second output operation on the input signal, and
    a differential circuit for executing a differential operation which switches between a first driving current for driving the first output circuit and a second driving current for driving the second output circuit in accordance with the waveform output from the integrating circuit.

9. The signal output circuit as claimed in claim 8, wherein the first output circuit includes an amplifying circuit for amplifying the input signal, wherein the second output circuit includes a muting circuit for muting an output signal.

10. The signal output circuit as claimed in claim 9, wherein both the first output and the second output circuit includes a differential circuit.

11. The signal output circuit as claimed in claim 8, wherein the output operation switching circuit further includes
 a reference voltage source for generating a reference voltage, and
 a switching circuit for comparing the output of the integrating circuit and the reference voltage, the switching circuit supplying the first driving current to the first output circuit and stopping supply to the second output circuit when the output of the integrating circuit is greater than the reference voltage, the switching circuit supplying the second driving current to the second output circuit and stopping supply to the first output circuit when the output of the integrating circuit is less than the reference voltage.

12. The signal output circuit as claimed in claim 11, wherein the first output circuit includes an amplifying circuit for amplifying the input signal, wherein the second output circuit includes a muting circuit for muting an output signal.

13. The signal output circuit as claimed in claim 12 wherein both the first output circuit and the second output circuit includes a differential circuit.

* * * * *